(12) United States Patent
Lin et al.

(10) Patent No.: US 7,649,612 B2
(45) Date of Patent: Jan. 19, 2010

(54) PHASE SHIFTING PHOTOLITHOGRAPHY SYSTEM

(75) Inventors: Qunying Lin, Singapore (SG); Sia Kim Tan, Singapore (SG); Liang-Choo Hsia, Singapore (SG)

(73) Assignee: Chartered Semiconductor Manufacturing Ltd., Singapore (SG)

(*) Notice: Subject to any disclaimer, the term of this patent is extended or adjusted under 35 U.S.C. 154(b) by 511 days.

(21) Appl. No.: 11/307,245

(22) Filed: Jan. 27, 2006

(65) Prior Publication Data

US 2007/0177121 A1   Aug. 2, 2007

(51) Int. Cl.
  *G03B 27/54* (2006.01)
  *G03B 27/72* (2006.01)
(52) U.S. Cl. .......................... 355/67; 355/71
(58) Field of Classification Search .......... 355/67, 355/71, 53; 430/311, 320
  See application file for complete search history.

(56) References Cited

U.S. PATENT DOCUMENTS

| | | | |
|---|---|---|---|
| 5,835,196 A * | 11/1998 | Jackson | 355/53 |
| 6,239,878 B1 | 5/2001 | Goldberg | 356/520 |
| 6,918,105 B2 | 7/2005 | Mayhew | 716/21 |
| 6,920,628 B2 | 7/2005 | Chen et al. | 716/19 |
| 2004/0029023 A1* | 2/2004 | Misaka | 430/5 |
| 2008/0151209 A1* | 6/2008 | Naftali | 355/67 |
| 2008/0192224 A1* | 8/2008 | Gruner et al. | 355/71 |
| 2008/0213703 A1* | 9/2008 | Shafer et al. | 430/319 |
| 2008/0273185 A1* | 11/2008 | Omura et al. | 355/67 |
| 2008/0316445 A1* | 12/2008 | Watson et al. | 355/53 |
| 2009/0002654 A1* | 1/2009 | Warrick et al. | 355/30 |
| 2009/0009744 A1* | 1/2009 | Fiolka | 355/67 |

* cited by examiner

*Primary Examiner*—Peter B Kim
(74) *Attorney, Agent, or Firm*—Mikio Ishimaru

(57) ABSTRACT

A phase shifting photolithography system includes inserting a phase shift component in a path of an illumination, wherein the phase shift component modifies a portion of the illumination to a different, and controlling an aperture shutter of the phase shift component modifying an interference of the illumination and the illumination with the different phase.

20 Claims, 3 Drawing Sheets

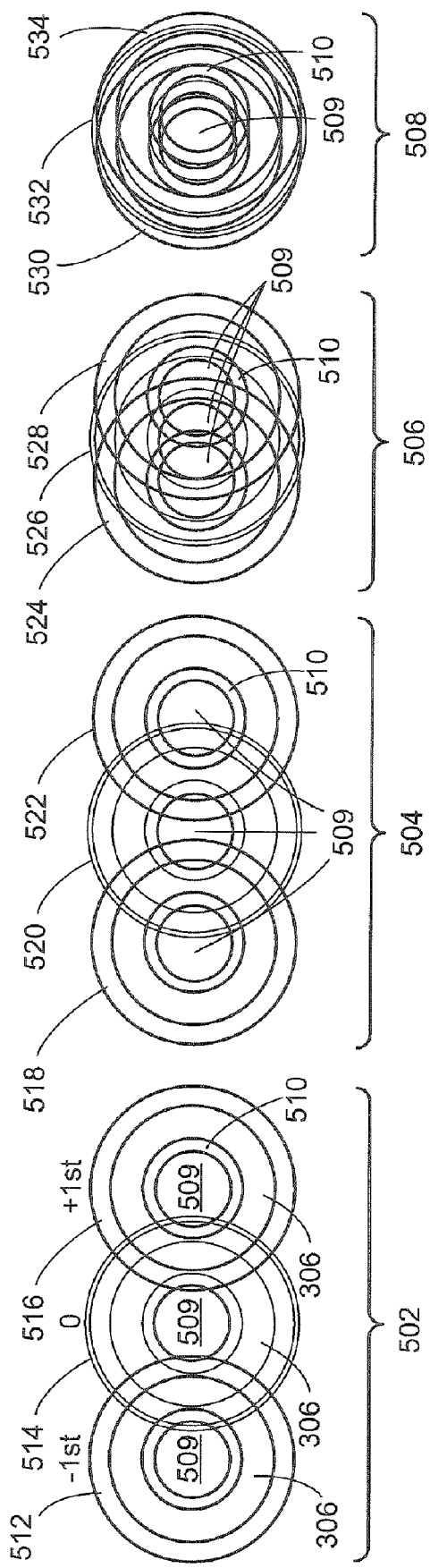
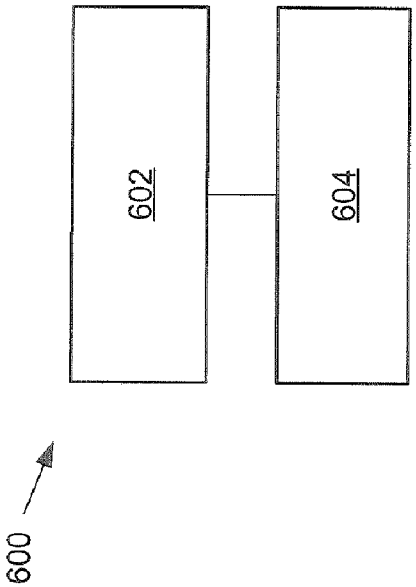
FIG. 5
FIG. 6

US 7,649,612 B2

PHASE SHIFTING PHOTOLITHOGRAPHY SYSTEM

TECHNICAL FIELD

The present invention relates to the field of photolithography, and more specifically phase shifting photolithography systems.

BACKGROUND ART

Modern consumer electronics, such as cellular phones, digital cameras, and music players, are packing more integrated circuits into an ever shrinking physical space with the expectations for decreasing cost. Numerous technologies have been developed to meet these requirements. One cornerstone for consumer electronics to continue proliferation into everyday life is the on-going size reduction of the integrated circuits.

The integrated circuit development and manufacturing communities must balance developing new technologies while controlling cost. The decreasing size of the integrated circuits presents a myriad of challenges with existing tools and equipment pushed beyond their limits. Numerous new approaches attempt to support the integrated circuit size reduction but require enormous capital investment for unproven new equipment thereby increasing cost.

One proven way to control and reduce cost is to use as much existing equipment and tools for the new technology nodes. Other challenges exist with leveraging existing tools and equipment. Most notably, the integrated circuit size may only be reduced slightly and not offer longevity to aggressively shrink the integrated circuits.

One promising technology offers a partial solution for amortizing existing investments while providing sufficient longevity to shrink the integrated circuits. This technology uses lenses and a process called optical processing. The size of integrated circuits is so small that the light used to transfer patterns from a stencil, or photolithography reticle, to the wafer behaves differently. This different light behavior perturbs the image transferred from the photolithography reticle to the wafer. In order to use existing light sources in a lithography system or control incremental investment for a light source, other solutions are required.

Thus, a need still remains for an optical processing that leverages existing manufacturing techniques while providing integrated circuits size features to meet the new market demands. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides inserting a phase shift component in a path of an illumination, wherein the phase shift component modifies a portion of the of the illumination to a different phase, and controlling an aperture shutter of the phase shift component modifying an interference of the illumination and the illumination with the different phase.

Certain embodiments of the invention have other aspects in addition to or in place of those mentioned or obvious from the above. The aspects will become apparent to those skilled in the art from a reading of the following detailed description when taken with reference to the accompanying drawings.

BRIEF DESCRIPTION OF THE DRAWINGS

FIG. 5 is a cross-sectional view of different diffractions from the reticle of FIG. 1; and FIG. 6 is a flow chart of a system for the phase shifting photolithography system in an embodiment of the present invention.

BEST MODE FOR CARRYING OUT THE INVENTION

Figure 1:
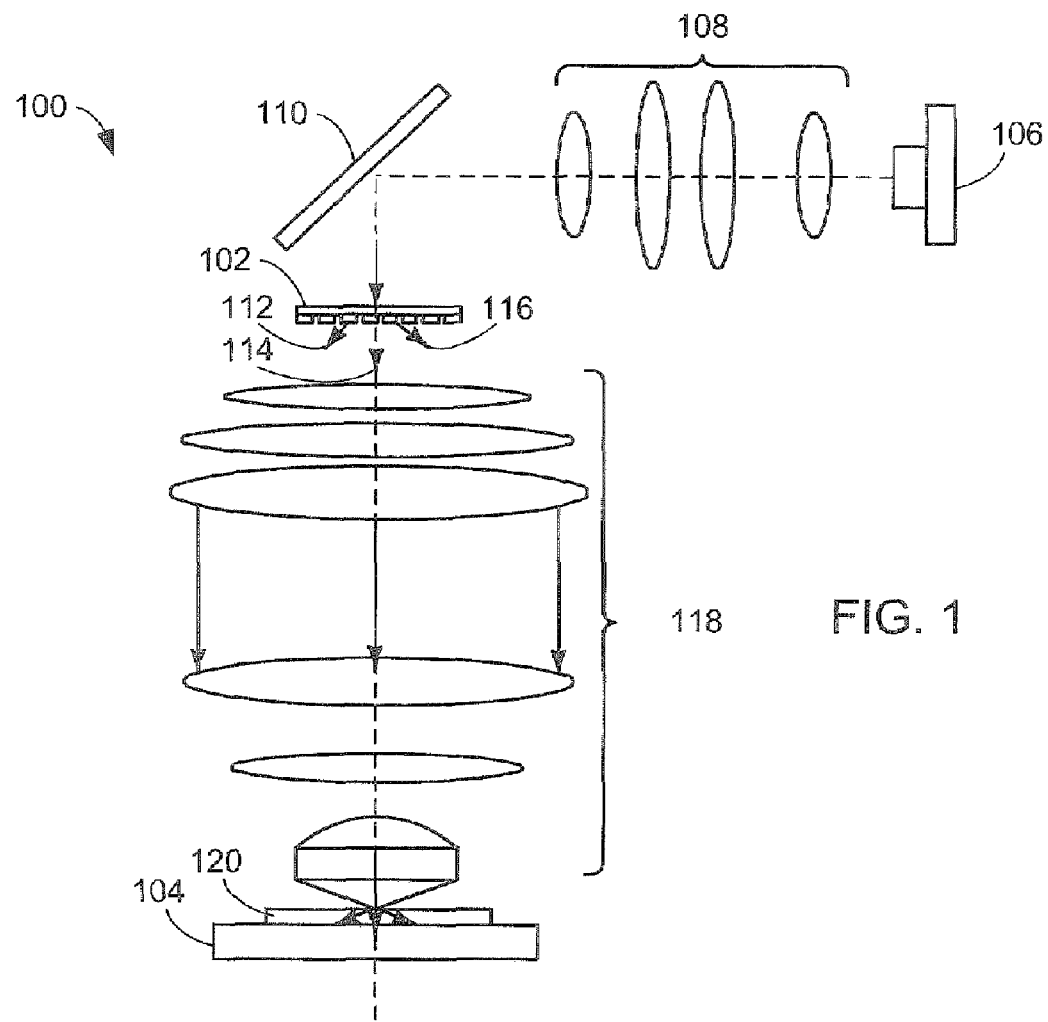
FIG. 1 is a semi-diagrammatic view of a phase shifting photolithography system in an embodiment of the present invention.

In the following description, numerous specific details are given to provide a thorough understanding of the invention. However, it will be apparent that the invention may be practiced without these specific details. In order to avoid obscuring the present invention, some well-known system configurations, and process steps are not disclosed in detail. Likewise, the drawings showing embodiments of the apparatus are semi-diagrammatic and not to scale and, particularly, some of the dimensions are for the clarity of presentation and are shown greatly exaggerated in the drawing FIGs.

The term "horizontal" as used herein is defined as a plane parallel to the conventional plane or surface of the integrated circuit wafer, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane. The term "processing" as used herein includes deposition of material or photoresist, patterning, exposure, development, etching, cleaning, and/or removal of the material or photoresist as required in forming a described structure.

Referring now to FIG. 1, therein is shown a semi-diagrammatic view of a phase shifting photolithography system 100 in an embodiment of the present invention. The phase shifting photolithography system 100 serves as an optical processor utilizing an illumination source (not shown) and various optical components to reduce patterns on a reticle 102 to a wafer 104. An illumination from the illumination source may be represented by an amplitude of the illumination, a phase of the illumination, and a frequency of the illumination. This representation may be expressed in a frequency domain using a Fourier Transform. Each optical component along the illumination path from the illumination source to the wafer 104 may manipulate or modify the illumination, wherein the operation by each optical component may be expressed as a Fourier Transform.

The illumination used for imaging passes through a phase shift component 106, wherein the phase shift component 106 shifts the phase of a portion of the illumination. An illumination from the phase shift component 106 passes through a first lens system 108, such as a condenser lens system. An angle reflector 110 changes the direction of the illumination from the first lens system 108 toward the reticle 102. The reticle 102 has patterns on a side opposite the angle reflector 110 to be imaged to the wafer 104.

Shrinking integrated circuit geometries drive the dimensions of the patterns of the reticle 102 in the order of the illumination wavelength causing diffraction of the illumination. The diffracted illumination is shown as a −1 diffraction order 112, a 0 diffraction order 114, and a +1 diffraction order 116. Higher order diffractions are possible. The −1 diffraction order 112 and the +1 diffraction order 116 along with higher diffraction order improves the image quality transferred to the wafer 104 from the reticle 102. The diffraction operation caused by the patterns of the reticle 102 performs a Fourier Transform such that the diffracted illumination from the reticle 102 contains spatial frequencies of the patterns.

The diffracted illumination from the reticle 102 passes through a second lens system 118, such as a projection lens system or an objective lens system. The second lens system 118 reduces and focuses the patterns of the reticle 102 to the wafer 104 through a processing layer 120, such as a photo resist layer or antireflection coating. The second lens system 118 performs an inverse Fourier Transform on the diffracted illumination imaging the pattern of the reticle 102 to the wafer 104, the image plane. However, as the patterns or pitch of the feature shrinks, the ratio of the magnitude of the 0 diffraction order 114 to the magnitude of the first diffraction order, the −1 diffraction order 112 and the +1 diffraction order 116, becomes greater. This increase in the ratio may result in a degradation of the image quality limiting the resolution. The phase shift component 106 may control the intensity of the 0 diffraction order 114 to improve image quality transferred to the wafer 104.

For illustrative purposes, the phase shift component 106 is shown located as the first optical component after the illumination source, although it is understood that the location of the phase shift component 106 may be different, as well. Also for illustrative purposes, the phase shift component 106 is shown as a single component, although it is understood the phase shift operation may be performed by a number of optical components, as well.

Figure 2:
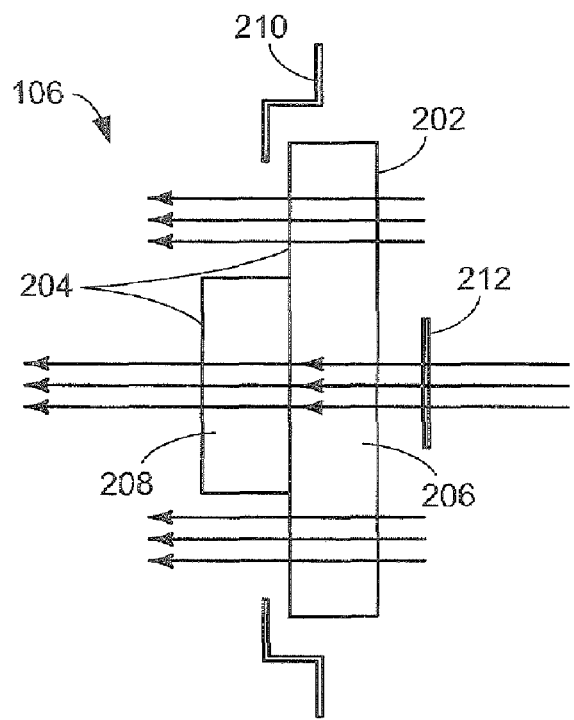
FIG. 2 is a cross-sectional view of the phase shift component.

Referring now to FIG. 2, there is shown a cross-sectional view of the phase shift component 106. The phase shift component 106 includes an illumination side 202, an output side 204, a first optical region 206, and a second optical region 208. The illumination side 202 is the side of the first optical region 206 facing the illumination source, wherein the first optical region 206 passes the illumination with no change in phase or 0 degree phase. The output side 204 includes the side of the first optical region 206 and the second optical region 208 that is the side opposite the illumination source. The second optical region 208 shifts the phase of the illumination 180 degrees. The phase shift component 106 also includes an aperture shutter 210 that may control the partial coherency of the illumination and the area of the 0 degree phase illumination. An inner shutter 212 of the phase shift component 106 may also be adjusted effect the illumination. For illustrative purposes, the incident illumination to the phase shift component 106 is shown as collimated, although it is understood the incident illumination may not be collimated, as well.

Figure 3:
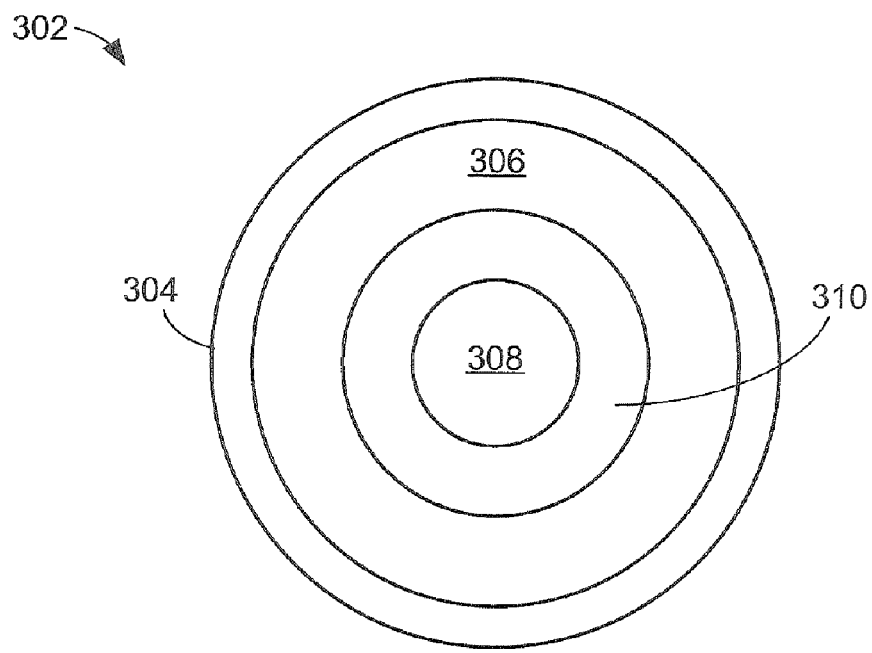
FIG. 3 is a cross-sectional view of a phase shifted illumination from the phase shift component of FIG. 2.

Referring now to FIG. 3, therein is shown a cross-sectional view of a phase shifted illumination 302 from the phase shift component 106 of FIG. 2. The phase shifted illumination 302 is depicted as concentric circular areas having a first outer ring area 304 substantially absent of illumination due to the aperture shutter 210 shown in FIG. 2. A second outer ring area 306 represents the illumination with 0 degree phase. An inner area 308 represents the illumination with 180 degree phase shift. An interference ring area 310 between the second outer ring area 306 and the inner area 308 represents the area substantially void of illumination from the destructive interference of the 0 degree phase illumination with the 180 degree phase illumination.

Figure 4:
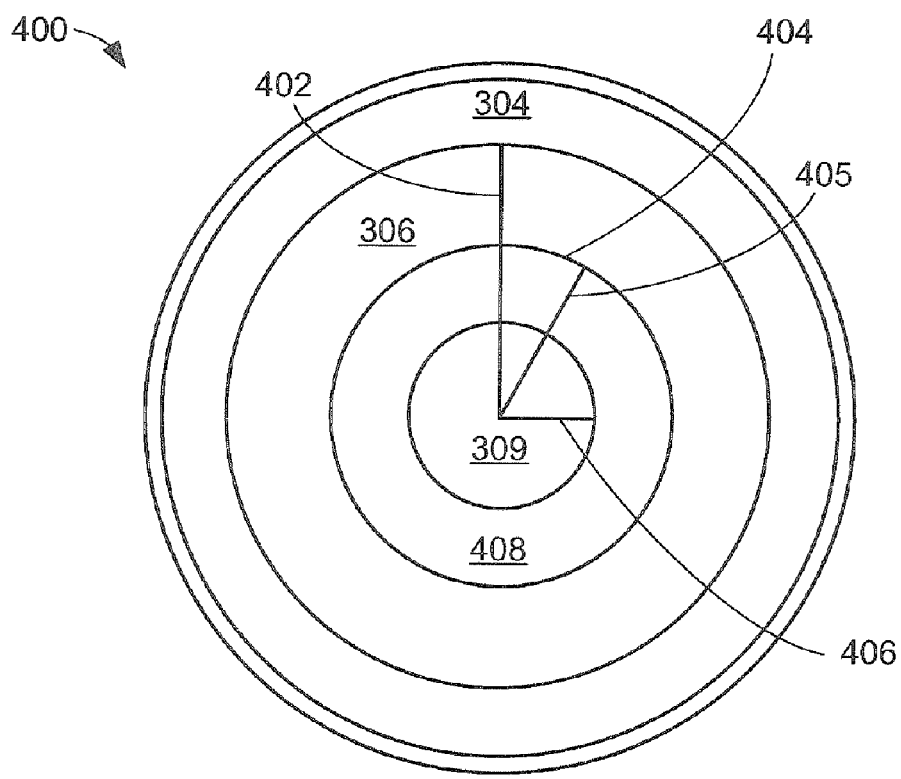
FIG. 4 is a semi-diagrammatic view of the phase shifted illumination of FIG. 3.

Referring now to FIG. 4, therein is shown a semi-diagrammatic view of the phase shifted illumination 400 from the phase shift component 106 of FIG. 2. The semi-diagrammatic view shows an outer radius 402 denoted as a variable $r_3$, an interference region 404 for 180 degree phase illumination with a phase shifted radius 405 denoted as a variable $r_2$, and an inner radius 406 denoted as a variable $r_1$. The first outer ring area 306, denoted as a variable $A_0$ and expressed in equation 1, between the outer radius 402 and the phase shifted radius 405 is the area of the 0 degree phase illumination with the interference region 404 substantially negligible. The inner area 309 within the inner radius 406 is the area of the inner shutter 212 of FIG. 2 used to control and partially block the 180 degree phase illumination. An effective phase shifted ring 408 the 180, denoted as a variable $A_p$ and expressed in equation 1, between the inner radius 406 and the phase shifted radius 405 is the area of the effective 180 degree phase illumination.

The opening of the aperture shutter 210 shown in FIG. 2 controls the outer radius 402 of the diffraction orders. The inner radius 406 controls the second optical region 208 shown in FIG. 2 of the 180 degree phase area. The 0 degree phase illumination interferes with the 180 degree phase illumination. The effective 0 degree illumination, the second outer ring 306, may be manipulated by the aperture shutter 210 changing the first outer ring area 304. The interference region 404 may vary depending on the amount of 0 degree phase illumination passing through the phase shift component 106 shown in FIG. 2 and the aperture shutter 210 adjustment. For calculation simplification, the interference region 404 is substantially negligible.

$$A_p = \pi r_2^2 - \pi r_1^2 \qquad (1)$$

$$A_0 = \pi r_3^2 - \pi r_2^2 \qquad (2)$$

Equation 3 expresses the modification of the amplitude of the 0 diffraction order 114 and provides the amplitude of the first diffraction order, −1 diffraction order 112 and +1 diffraction order 116.

$$A_0 - A_p \qquad (3)$$

Equation 4 expresses the relationship to improve image quality transferred to the wafer 104 from the patterns of the reticle 102.

$$A_0 - A_p = 0 \qquad (4)$$

Expanding the area variables in equation 4 provides equation 5.

$$(\pi r_3^2 - \pi r_2^2) - (\pi r_2^2 - \pi r_1^2) = 0 \qquad (5)$$

After some mathematical simplifications, equation 5 is now expressed as equation 6.

$$r_3^2 - 2r_2^2 + r_1^2 = 0 \qquad (6)$$

For maximum destructive interference of the 0 diffraction order 114 and elimination of the inner shutter 212 of FIG. 2, $r_1 = 0$ to provide equation 7.

$$r_3^2 = 2r_2^2 \qquad (7)$$

The aperture shutter 210 and the phase shift component 106 may provide a relationship of the no phase change or 0 degree phase illumination with the outer radius 402 ($r_3$) and the interference radius 404 ($r_2$) as expressed in equation 7 to improve the image quality and doubling the pitch.

Referring now to FIG. 5, therein is shown a cross-sectional view of different diffractions from the reticle 102 of FIG. 1. The dimensions of the patterns of the reticle 102 are in the order of the illumination wavelength causing diffraction. Larger dimensions of the patterns of the reticle 102 decreases the amount of the diffraction of the phase shifted illumination 302 shown in FIG. 3 incident on the reticle 102. The cross-sectional view shows a first diffraction pattern 502, a second diffraction pattern 504, a third diffraction pattern 506, and a fourth diffraction pattern 508. For illustrative purposes, the cross-sectional view depicts four diffraction patterns, although it is understood the diffraction patterns may be continuous and may not be constrained to four diffraction patterns, as well.

The first diffraction pattern 502 includes the phase shifted illumination 302 (shown in FIG. 3), with an inner ring 509, an interference area 510 and the second outer ring area 306, diffracted into a first −1 diffraction order 512, a first 0 diffraction order 514, and a first +1 diffraction order 516 for predetermined dimensions of the patterns of the reticle 102. The first −1 diffraction order 512 and the first +1 diffraction order 516 overlap the first 0 diffraction order 514.

The second diffraction pattern 504 includes the phase shifted illumination 302 (shown in FIG. 3), with the inner ring 509, the interference area 510 and the second outer ring area 306, diffracted into a second −1 diffraction order 518, a second 0 diffraction order 520, and a second +1 diffraction order 522 for the dimensions of the patterns of the reticle 102 larger than the patterns causing the first diffraction pattern 502. The larger dimension of the patterns of the reticle 102 forms less diffraction such that the second −1 diffraction order 518 and the second +1 diffraction order 522 overlaps the second 0 diffraction order 520 more than the overlap in the first diffraction pattern 502.

The third diffraction pattern 506 includes the phase shifted illumination 302 (shown in FIG. 3), with the inner ring 509, the interference area 510 and the second outer ring area 306, diffracted into a third −1 diffraction order 524, a third 0 diffraction order 526, and a third +1 diffraction order 528 for the dimensions of the patterns of the reticle 102 larger than the patterns causing the second diffraction pattern 504. The larger dimension of the patterns of the reticle 102 forms less diffraction such that the third −1 diffraction order 524 and the third +1 diffraction order 528 overlaps the third 0 diffraction order 526 more than the overlap in the second diffraction pattern 504.

The fourth diffraction pattern 508 includes the phase shifted illumination 302 (shown in FIG. 3), with the inner ring 509, the interference area 510 and the second outer ring area 306, diffracted into a fourth −1 diffraction order 530, a fourth 0 diffraction order 532, and a fourth +1 diffraction order 534 for the dimensions of the patterns of the reticle 102 larger than the patterns causing the third diffraction pattern 506. The larger dimension of the patterns of the reticle 102 forms less diffraction such that the fourth −1 diffraction order 530 and the fourth +1 diffraction order 534 overlaps the fourth 0 diffraction order 532 overlap more than the overlap in the third diffraction pattern 506. The overlap of the fourth diffraction pattern 508 provides a minimum of the fourth −1 diffraction order 530 and the fourth +1 diffraction order 534.

The −1 diffraction order 112 of FIG. 1 and the +1 diffraction order 116 of FIG. 1, as well as higher order diffractions, are necessary illumination components such that the spatial frequency variation from the patterns from the reticle 102 may be imaged to the wafer 104. A comparison of the magnitude of the nonzero diffraction order from the first diffraction pattern 502 to the fourth diffraction pattern 508 indicate that the image quality may degrade. A counter to the potential image degradation with lower magnitude of the −1 diffraction order 112 and the +1 diffraction order 116 is placing predetermined scattering patterns (not shown) on the reticle 102.

It has been discovered that the phase shift component 106 (shown in FIG. 2) may control the diffraction caused by the reticle 102 such that amplitude of the 0 diffraction order 114 is equal to the sum of the amplitude of the −1 diffraction order and the +1 diffraction order 116 as well as other higher diffraction orders that may exist. The highest contrast value of 1 on the wafer 104 from the patterns of the reticle 102 occurs from the minimum intensity, given by the inverse Fourier transformation of all the diffraction orders captured by the second lens system 118, of zero. The amplitude of the 0 diffraction order 114 may be controlled with the total amplitude of the 0 degree phase and 180 degree phase illuminations along with the amount of interference interaction.

Referring now to FIG. 6, therein is shown a flow chart of a system 600 for the phase shifting photolithography system 100 in an embodiment of the present invention. The system 600 includes inserting a phase shift component in a path of an illumination, wherein the phase shift component modifies a portion of the of the illumination to a different phase in a block 602; and controlling an aperture shutter of the phase shift component modifying an interference of the illumination and the illumination with the different phase in a block 604.

It has been discovered that the present invention thus has numerous aspects.

An aspect is that the present invention improves the image quality transferred from the patterns on the reticle to the wafer while potentially using existing lithography equipment and controlling additional capital investment. The phase shift component may control destructive interference providing some first order diffraction with the center area of the phase shifted illumination minimized. The destructive interference center of the phase shift illumination provides additional capability to capture the spatial frequencies on the reticle. This improves the contrast and resolution at the wafer allowing the doubling the pitch of the patterns of the reticle.

Another aspect is the control of the aperture shutter. Other optical components, such as a low pass filter or a high pass filter, may be used to modify the illumination that may also be controlled by shutters, such as an interior shutter or a perimeter shutter.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the phase shifting optical processing method and apparatus of the present invention furnish important and heretofore unknown and unavailable solutions, capabilities, and functional aspects for shrinking integrated circuit geometries while controlling additional capital investments. The resulting processes and configurations are straightforward, cost-effective, uncomplicated, highly versatile and effective, can be implemented by adapting known technologies, and are thus readily suited for efficiently and economically manufacturing devices, such as integrated circuits, that may be manufactured with optical processing techniques and fully compatible with conventional manufacturing processes and technologies.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the scope of the included claims. All matters hithertofore set forth herein or shown in the accompanying drawings are to be interpreted in an illustrative and non-limiting sense.

What is claimed is:

1. A phase shifting photolithography system comprising:
    inserting a phase shift component in a path of an illumination, wherein the phase shift component modifies a portion of the of the illumination to a different phase; and
    controlling an aperture shutter of the phase shift component modifying an interference of the illumination and the illumination with the different phase.

2. The system as claimed in claim 1 wherein inserting the phase shift component in the path of the illumination comprises placing the phase shift component next to an illumination source.

3. The system as claimed in claim 1 wherein inserting the phase shift component in the path of the illumination comprises producing a 180 degree modification of the phase of the portion of the illumination by the phase shift component.

4. The system as claimed in claim 1 wherein controlling the aperture shutter of the phase shift component comprises producing a minimum of an intensity at the center of a phase shifted illumination.

5. The system as claimed in claim 1 further comprising forming a first optical region of the phase shift component passing the illumination with no phase change and forming a second optical region of the phase shift component shifting the phase of the illumination by 180 degrees.

6. A phase shifting photolithography system comprising:
    inserting a phase shift component in a path of an illumination, wherein the phase shift component modifies a portion of the of the illumination to a different phase of 180 degrees; and
    controlling an aperture shutter of the phase shift component modifying magnitudes of the illumination with no phase change and an interference with the illumination with the different phase of 180 degrees.

7. The system as claimed in claim 6 wherein controlling the aperture shutter of the phase shift component comprises controlling an outer radius, $r_3$, of the illumination with no phase change in a relation to an interference radius, $r_2$, to the interference area following $r_3^2 = 2r_2^2$.

8. The system as claimed in claim 6 wherein inserting the phase shift component in the path of an illumination comprises improving an image contrast on a wafer.

9. The system as claimed in claim 6 wherein inserting the phase shift component in the path of the illumination comprises doubling an image pitch on a wafer.

10. The system as claimed in claim 6 further comprising inserting optical filters for modifying the illumination.

11. A phase shifting photolithography system comprising:
    a phase shift component in a path of an illumination, wherein the phase shift component modifies a portion of the of the illumination to a different phase; and
    an aperture shutter of the phase shift component to modify an interference of the illumination and the illumination with the different phase.

12. The system as claimed in claim 11 wherein the phase shift component in the path of the illumination comprises the phase shift component next to an illumination source.

13. The system as claimed in claim 11 wherein the phase shift component in the path of the illumination comprises a 180 degree modification of the phase of the portion of the illumination by the phase shift component.

14. The system as claimed in claim 11 wherein the aperture shutter of the phase shift component comprises a minimum of intensity at the center of a phase shifted illumination.

15. The system as claimed in claim 11 further comprising a first optical region of the phase shift component passing the illumination with no phase change and a second optical region of the phase shift component shifting the phase of the illumination by 180 degrees.

16. The system as claimed in claim 11 wherein:
    the phase shift component in a path of an illumination modifies a portion of the illumination to a different phase of 180 degrees, and
    the aperture shutter of the phase shift component modifies magnitudes of the illumination with no phase change and the illumination with the different phase of 180 degrees.

17. The system as claimed in claim 16 wherein the aperture shutter of the phase shift component comprises an outer radius, $r_3$, of the illumination with no phase change in a relation to an interference radius, $r_2$, to the interference area following $r_3^2 = 2r_2^2$.

18. The system as claimed in claim 16 wherein the phase shift component in the path of an illumination comprises an image contrast improved on a wafer.

19. The system as claimed in claim 16 wherein the phase shift component in the path of the illumination comprises an image pitch doubled on a wafer.

20. The system as claimed in claim 16 further comprising optical filters for modification of the illumination.

* * * * *